United States Patent
Alpert et al.

(10) Patent No.: US 8,370,782 B2
(45) Date of Patent: Feb. 5, 2013

(54) BUFFER-AWARE ROUTING IN INTEGRATED CIRCUIT DESIGN

(75) Inventors: Chuck Alpert, Austin, TX (US); Zhuo Li, Austin, TX (US); Michael David Moffitt, Austin, TX (US); Chin Ngai Sze, Austin, TX (US); Paul G Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 12/823,232

(22) Filed: Jun. 25, 2010

(65) Prior Publication Data

US 2011/0320992 A1 Dec. 29, 2011

(51) Int. Cl.
*G06F 17/50* (2006.01)
(52) U.S. Cl. .................. 716/114; 716/126; 716/132
(58) Field of Classification Search ........................ None
See application file for complete search history.

(56) References Cited

U.S. PATENT DOCUMENTS

| | | | |
|---|---|---|---|
| 6,442,745 B1 | 8/2002 | Arunachalam et al. | |
| 6,996,512 B2 | 2/2006 | Alpert et al. | |
| 7,036,104 B1 * | 4/2006 | Alpert et al. | 716/114 |
| 7,062,743 B2 | 6/2006 | Kahng et al. | |
| 7,065,729 B1 * | 6/2006 | Chapman | 716/129 |
| 7,194,720 B1 * | 3/2007 | Borer et al. | 716/121 |
| 7,283,942 B1 * | 10/2007 | Lewis | 703/14 |
| 7,367,005 B2 * | 4/2008 | Kosugi et al. | 716/114 |
| 7,603,478 B2 * | 10/2009 | Thurman et al. | 709/238 |
| 7,853,915 B2 * | 12/2010 | Saxena et al. | 716/129 |
| 8,065,652 B1 * | 11/2011 | Salowe et al. | 716/139 |
| 2008/0170514 A1 | 7/2008 | Hentschke et al. | |
| 2009/0172628 A1 * | 7/2009 | Chyan et al. | 716/13 |
| 2009/0319977 A1 | 12/2009 | Saxena et al. | |
| 2011/0055786 A1 * | 3/2011 | Gao | 716/126 |
| 2011/0055791 A1 * | 3/2011 | Gao | 716/131 |

OTHER PUBLICATIONS

Alpert et al., "Delay and Slew Metrics Using Lognormal Distribution," DAC 2003, pp. 382-385.*
Alpert et al., "Buffered Steiner Trees for Difficult instances," 2001 ACM pp. 4-9.*
Sze et al., "A Place and Route Aware Buffered Steiner Tree Construciton," 2004 IEEE, pp. 355-360.*
Lillis et al., "Simultaneous Routing and Buffer Insertion for High Performance Interconnect," 1996 IEEE, pp. 148-153.*
Cong et al., "Routing Tree Construction under Fixed Buffer Locations," 2000 ACM DAC, pp. 379-384.*
Tang et al., "A New Algorithm for Routing Tree Construction with Buffer Insertion and Wire Sizing under Obstacle Constraints," 2001 IEEE, pp. 49-56.*

(Continued)

*Primary Examiner* — Leigh Garbowski
(74) *Attorney, Agent, or Firm* — Garg Law Firm, PLLC; Rakesh Garg; Libby Z. Toub

(57) ABSTRACT

A method, system, and computer usable program product for buffer-aware routing in integrated circuit design are provided in the illustrative embodiments. The design has cells, and the circuit includes buffers and wires. A route is received from a set of routes. The route couples a first point in the circuit to a second point in the circuit and including at least one buffer between the first point and the second point. A determination is made whether the route violates a set of hard constraints for a part of the circuit, where the set of hard constraints includes a reach length constraint. In response to the route not violating any hard constraint in the set of hard constraints, the route is selected as a buffer-aware routing solution between the first and the second points in the circuit.

30 Claims, 10 Drawing Sheets

OTHER PUBLICATIONS

IBM, Method of Placing Buffers Using Buffers Pinned Along a Global Route to Guide the Placement, ip.com, Mar. 26, 2009, 1-2, IPCOM000181092D.

IBM, Method of detection and repair of scenic routes in route-first buffering methodology, ip.com, Dec. 3, 2009, 1-5, IPCOM000190526D.

Cho et al; BoxRouter 2.0: Architecture and Implementation of a Hybrid and Robust Global Router, Dept. of ECE, The University of Texas at Austin, Austin, TX 78712, USA.

Gao et al; A New Global Router for Modern Designs, 232-237.

* cited by examiner

FIG. 1
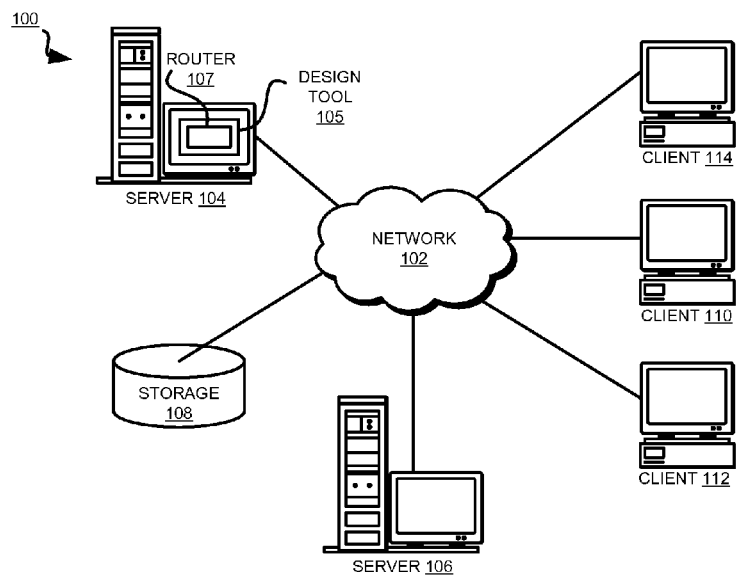
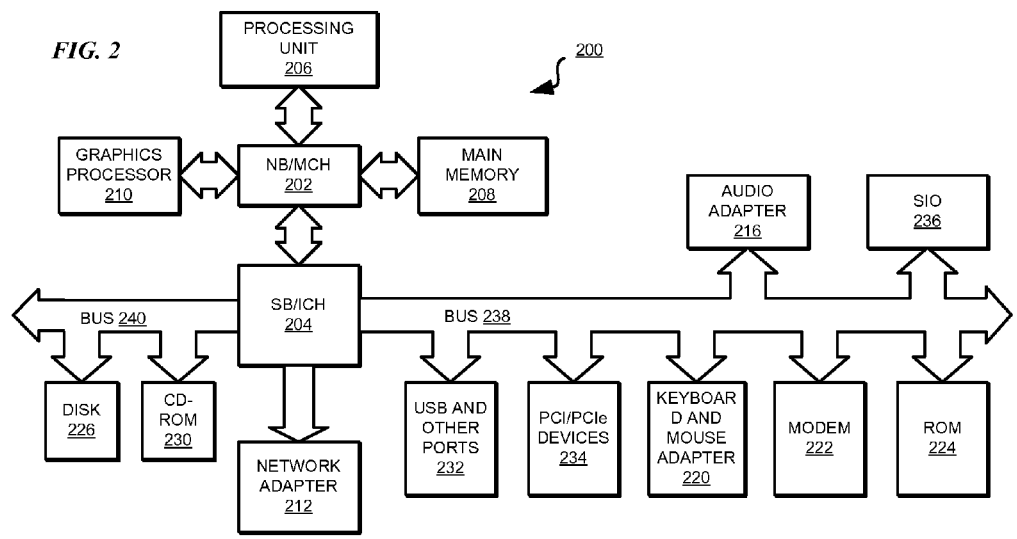
FIG. 2

| | AVG 20% (MAR) | NETS OVER 100% | NETS OVER 90% | SCENIC NETS | FOM |
|---|---|---|---|---|---|
| OLD FLOW | 80% | 3322 | 11315 | 9148 | -24209 |
| NEW FLOW | 79% | 1157 | 6783 | 2067 | -17522 |

BUFFER-AWARE ROUTING IN INTEGRATED CIRCUIT DESIGN

BACKGROUND OF THE INVENTION

1. Field of the Invention

The present invention relates generally to an improved data processing system, and in particular, to a computer implemented method for integrated circuit design. Still more particularly, the present invention relates to a computer implemented method, system, and computer usable program code for buffer aware routing in integrated circuit (IC) design.

2. Description of the Related Art

Modern day electronics include components that use integrated circuits. Integrated circuits are electronic circuits formed using Silicon as a substrate and by adding impurities to form solid-state electronic devices, such as transistors, diodes, and resistors. Commonly known as a "chip", an integrated circuit is generally encased in hard plastic. The components in modern day electronics generally appear to be rectangular black plastic pellets with connector pins protruding from the plastic encasement.

Circuit designers use a variety of software tools to design electronic circuits that accomplish an intended task. For example, a digital circuit may be designed to accept digital inputs, perform some computation, and produce a digital output. An analog circuit may be designed to accept analog signals, manipulate the analog signals, such as my amplifying, filtering, or mixing the signals, and produce an analog or digital output. Generally, any type of circuit can be designed as an IC.

The software tools used for designing ICs produce, manipulate, or otherwise work with the circuit layout at very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

The software tools manipulate these components at the components level, or blocks of components level. A block of components is also known as a cell. A cell in an IC design is a portion of the IC design. One way of identifying cells in an IC design is to overlay a grid of imaginary vertical and horizontal lines on the design, and deeming each portion of the IC design bound by horizontal and vertical lines as a cell. Cells formed in this manner are commonly known as global routing cells, or g-cells. Imposing such a grid on an IC design abstracts the global routing problem away from the actual wire implementation and gives a more mathematical representation of the task.

An IC design software tool can, among other functions, manipulate cells, or interconnect components of one cell with components of other cells. The interconnects between components are called wires. A wire is a connection between parts of electronic components, and is formed using a metallic material that conducts electricity.

Placement problem is the problem of placing the cells of a chip such that the design meets all the design parameters of the chip. Routing is the process of connecting the pins after placement. In other words, placement results in a rendering of the components of various cells as being located in certain positions in the design, whereas routing results in a rendering of how the metal layers would be populated with that placement.

A wire can be designed to take any one of the several available paths in a design. Placement of a wire on a certain path, or track, is a part of routing.

Router is a component of IC design tools that performs the routing function. Once the placement component—known as a placer—has performed the placement function, the router attempts to connect the wires without causing congestion. For example, if a design parameter calls for no more than five wires in a given area, the router attempts to honor that restriction in configuring the wiring. Such limitations on the wiring are a type of design constraints and are called congestion constraints. Other types of design constraints may include, for example, blocked areas—cell areas where wires may not be routed.

A global router divides the routing region into small tiles and attempts to route nets through the tiles such that no tile overflow its capacity. After global routing, wires must be assigned to actual tracks within each tile, followed by detail routing which must connect each global route to the actual pin shape on the cell. Another type of router—known as the detailed router—performs the detailed routing. The global and detailed routing produced during the design process is usually further modified during optimization of the design.

SUMMARY OF THE INVENTION

The illustrative embodiments provide a method, system, and computer usable program product for buffer-aware routing in a design of an integrated circuit. The design has cells, and the circuit includes buffers and wires. An embodiment receives a route from a set of routes. The route couples a first point in the circuit to a second point in the circuit and including at least one buffer between the first point and the second point. The embodiment determines whether the route violates a set of hard constraints for a part of the circuit, where the set of hard constraints includes a reach length constraint. In response to the route not violating any hard constraint in the set of hard constraints, the embodiment selects the route as a buffer-aware routing solution between the first and the second points in the circuit.

In another embodiment, the reach length constraint is a constraint on a length of routes between any two points in the circuit such that the slew and timing characteristics of a signal over a given route meets a design specification for slew and delay for the signal in the design.

In another embodiment, the set of hard constraints further includes a plane constraint, where the plane constraint restricts the route to a specific plane in the design.

In another embodiment, the set of hard constraints further includes a wirecode constraint, where the wirecode constraint restricts the route to use at least one specific type of wire.

In another embodiment, the set of hard constraints further includes a blockage constraint, where the blockage constraint prohibits placement of a buffer over a blockage at a specified layer of the design.

In another embodiment, the set of hard constraints further includes a scenic ratio constraint, where the scenic ratio constraint restricts a length of the route to a specific proportion of a desired length for the route in the design.

An embodiment further includes determining whether the route violates a soft constraint for the part of the circuit, where a violation threshold is associated with the soft constraint, and wherein the selecting is further responsive to the route not violating the soft constraint beyond the threshold.

BRIEF DESCRIPTION OF THE DRAWINGS

The novel features believed characteristic of the invention are set forth in the appended claims. The invention itself;

however, as well as a preferred mode of use, further objectives and advantages thereof, will best be understood by reference to the following detailed description of an illustrative embodiment when read in conjunction with the accompanying drawings, wherein:

FIG. 1 depicts a pictorial representation of a network of data processing systems in which illustrative embodiments may be implemented;

FIG. 2 depicts a block diagram of a data processing system in which illustrative embodiments may be implemented;

DETAILED DESCRIPTION OF THE PREFERRED EMBODIMENT

Figure 3:
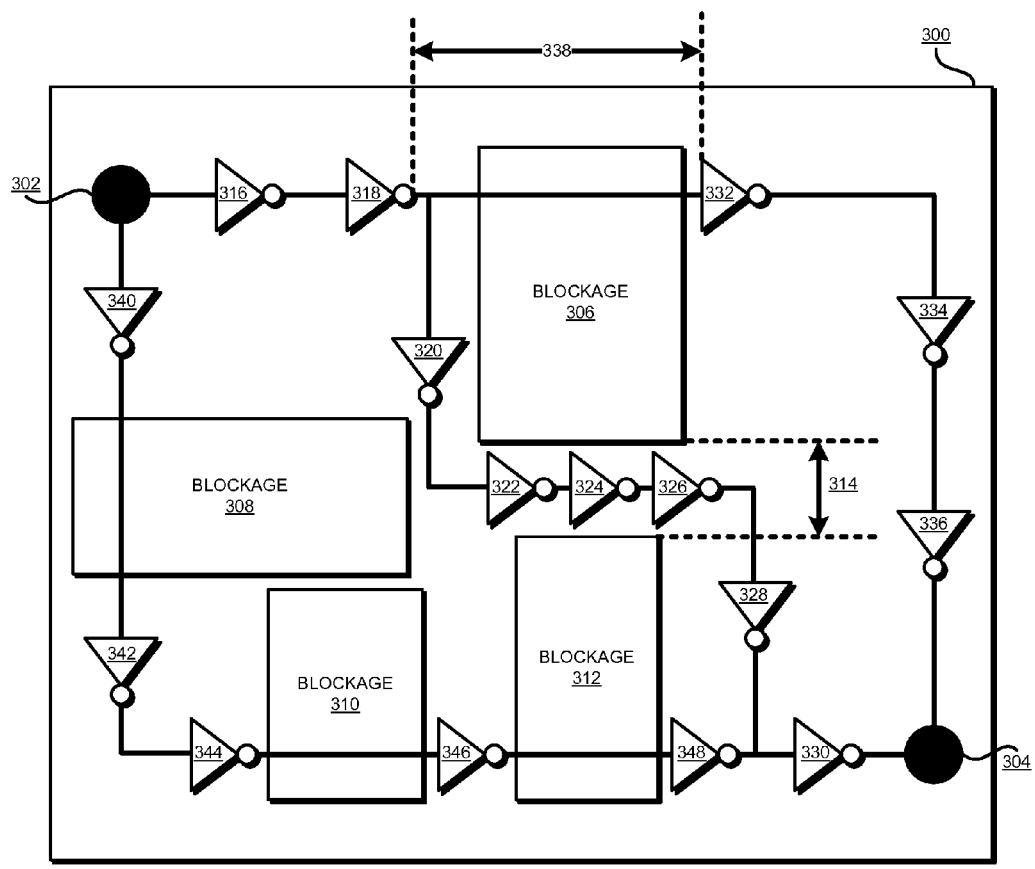
FIG. 3 depicts a rendering of an IC design showing example congestion and buffer placement problems that can be avoided using an illustrative embodiment.

In a portion of the IC design process, IC design tools generally employ various steps in producing an IC design that works as intended. A circuit designer generally creates the design in a computer programming language in the form of code. The IC design tool accepts the design in the code form and generates a rendering of the design in multiple layers that have be formed in a semiconducting material to create a circuit according to that design.

The IC design tool identifies cells in the design. The IC design tool manipulates a set of the cells to legalize the design. A set of cells is one or more cells. Legalizing the design is manipulating the cells so no cells overlap each other in the rendering or when formed in the semiconducting material. A legal design results from the legalizing operation. Cells are generally allowed to touch other cells but not overlap in a legal design.

A type of cell in an IC design is known as a standard cell. A standard cell is combination of solid-state devices, such as transistors, which take a specified number of input signals and produce a specified number of output signals, and which implement one or more circuit functions, such as logical AND, or logical OR functions.

A given cell includes a set of components and their interconnections. A set of components is one or more components. A cell may also include pins. A pin of a cell is a point of interconnection in the cell where a wire may be connected to couple a component of the cell with a component of another cell. In other words, pins of a cell are the locations of input/output (I/O) to and from the cell.

A set of pins for forming electrical connections in a cell is called a net. A Net list is a list of nets of a set of cells.

The interconnects are formed using wires. Minimizing the length of each wire in a given design is a design consideration in the design of the IC. As the wire length increases between two points increases, so does the delay in the signal being transmitted over the wire between the two points. To meet the timing requirement of signal, to wit, to keep the delay within a specified threshold, buffers are introduced along the wire length. A buffer may be an inverter or another component that reduces the delay between two points in a circuit.

The invention recognizes that buffer insertion is a non-trivial problem in IC design. The invention recognizes that inserting buffers between two points and then optimizing the wire length connecting the two points via those buffers places the buffers such that congestion occurs in certain areas of the design.

For example, a router may employ Steiner algorithm for computing routes. Given a certain number of points, such as the input pin, the output pin, and the buffers in between, Steiner algorithm computes the shortest route to connect those points. Steiner algorithm, however, does not account for congestion that may be created in an area of the design due to the computed shortest route between the input and output pins and the buffers.

The invention also recognizes that in the alternative method of optimizing a route between two points in the design first and then bringing the timing of the optimized route by inserting buffers along the route causes undesirable wire lengths between buffers, particularly around blockages. A blockage in a design is an area of the design where a component, such as a buffer, cannot be placed, and a wire may either not be routed over that area at all, or be routed only through corresponding areas on a specific set of layers.

The invention recognizes that some prior art routers do not take into account the slew and timing constraints for buffer placement. The invention further recognizes that prior art routers also do not account for buffer location limitations, plane keywords, and wirecodes. A plane keyword is a specification to restrict the placement of certain component or wire to certain layer or plane. A wirecode is a specification of the dimensions and electrical characteristics of a wire.

The invention further recognizes that prior art routers are also incapable of handling layer specific blockages for buffer placement. Most prior art routers perform routing using 2 dimensional (2D) technology where all the layers of a design are flattened to a single 2D layer for the purpose of solving the routing problem in one layer. The flattened 2D layer is then expanded to the various layers, the routing solution is assigned to the various layers, and corrections are made to the routing. Some prior art routers perform the routing in three dimensions (3D) where the routing is performed while maintaining the separate layers in a 3D structure. The 3D routers suffer from significantly longer runtimes than the 2D routers and still suffer from buffering problems described above.

Thus, the invention recognizes that the present methods of routing and buffer insertion either give rise to congestion or undesirable location of the buffers in a design. These problems with buffering routes in an IC design have become more pronounced with the advent of smaller scale technology, such as where the designs are created using less than 90 nanometer (nm) technology.

To address these and other related problems in present methods of buffering and routing in IC design, the illustrative embodiments provide a method, computer usable program product, and data processing system for buffer-aware routing in integrated circuit design. Using the illustrative embodiments, an IC design tool can be improved to make global and detailed routing buffer-aware. In other words, an IC design tool can be improved using an embodiment of the invention to compute routing solutions that, among other considerations, take into account the timing and slew constraints of the nets, accommodate plane keywords and wirecode specifications, avoid detours for certain category of nets, and respect layer-specific blockages.

A net, for example, may be categorized as a critical net or a non-critical net. A critical net, for example, may have a shorter wire length or detour requirement as compared to a non-critical net.

Furthermore, using the illustrative embodiments, the routing solution produced may have better congestion metrics and better buffer placement as compared to the routing solution for the same design created using prior art routers.

The examples in this disclosure are used only for the clarity of the description and are not limiting on the illustrative embodiments. Additional operations, actions, tasks, activities, and manipulations will be conceivable from this disclosure and the same are contemplated within the scope of the illustrative embodiments.

The illustrative embodiments are described using specific code, designs, layouts, schematics, and tools only as examples and are not limiting on the illustrative embodiments. The illustrative embodiments may be implemented with respect to any type of design data and any type of circuit that can be produced using an IC design tool.

Furthermore, the illustrative embodiments are described in some instances using particular software tools and data processing environments only as an example for the clarity of the description. The illustrative embodiments may be used in conjunction with other comparable or similarly purposed systems, applications, or architectures. For example, some embodiments may be described using a 2D routing methodology but are similarly applicable to a 3D routing methodology within the scope of the invention.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may have software applications or software tools executing thereon. For example, server 104 may include IC design tool 105. IC design tool 105 may utilize router 107 for global routing.

Servers 104 and 106, storage units 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client server environment in which the illustrative embodiments may be implemented. A client server environment enables software applications and data to be distributed across a network such that an application functions by using the interactivity between a client data processing system and a server data processing system. Data processing environment 100 may also employ a service-oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States and other countries), or Linux® (Linux is a trademark of Linus Torvalds in the United States and other countries). An object oriented programming system, such as the Java™ programming system, may run in conjunction with the operating system and provides calls to the operating system from Java™ programs or applications executing on data processing system 200 (Java is a trademark of Sun Microsystems, Inc., in the United States and other countries).

Instructions for the operating system, the object-oriented programming system, and applications or programs are located on storage devices, such as hard disk drive 226, and may be loaded into main memory 208 for execution by processing unit 206. The processes of the illustrative embodiments may be performed by processing unit 206 using computer implemented instructions, which may be located in a memory, such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

With reference to FIG. 3, this figure depicts a rendering of an IC design showing example congestion and buffer placement problems that can be avoided using an illustrative embodiment. Design 300 may be produced by an IC design tool, such as IC design tool 105 in FIG. 1.

Design 300 is a visual representation of an example design of an IC. Design 300 is depicted to include output pin 302 of a driving cell and input pin 304 of a receiver cell between which a route has to be computed. Blockages 306, 308, 310, and 312 may be blockages on the layer depicted. For example, blockage 306 may be a blockage caused by a third-party component, and blockage 308 may be caused by a macro component of the design.

One example route between pins 302 and 304 may avoid place the buffers and route through channel 314. The route formed by buffers 316, 318, 320, 322, 324, 326, 328, and 330 (referred to as route 316-324-330) may satisfy the timing and slew constraints, but may need more buffers, and creates congestion along the alleys between pins 302 and 304. Accordingly, buffers 316-330 in that numerosity are required to satisfy the buffer slew/timing reach length constraint. Forming route 316-324-330, however, may cause congestion in channel 314.

Slew reach length is a distance between two points in a circuit, or wire length between the two points, that should not be exceeded for a desired slew (slope) characteristic of the signal. Buffer slew reach length is the slew reach length between buffers or between a buffer and a pin.

Timing reach length is a distance between two points in a circuit, or wire length between the two points, that should not be exceeded for a desired timing (delay) characteristic of the signal. Critical timing reach length is timing reach length for a portion of a critical net. Buffer timing reach length is the timing reach length between buffers or between a buffer and a pin.

A buffer slew/timing reach length constraint according to the invention is a length constraint that when met or satisfied will satisfy the slew and timing reach length specifications for a given net. For example, in one design specification, such as in 45 nm 2× layer design, the slew reach length may be 1.7 millimeter (mm) and the critical timing reach length may be 0.52 mm. Accordingly, if distance between buffers or a buffer and a pin does not exceed 1.7 mm for noncritical nets or 0.52 mm for critical nets, the buffer slew/timing reach length constraint will be satisfied for the given net and design specification.

As another example, in another design specification, such as in 32 nm 16× layer design, the slew reach length may be 0.7 millimeter (mm) and the critical timing reach length may be 1.38 mm. Accordingly, if distance between buffers or a buffer and a pin does not exceed 0.7 mm, the buffer slew/timing reach length constraint will be satisfied for the given net and design specification.

Buffer slew/timing reach length constraint is described as the lesser of the slew reach length and the timing reach length only as an example. This method of determining the buffer slew/timing reach length constraint is not intended to be limiting on the invention. Buffer slew/timing reach length constraint may not simply be the lesser of the two reach lengths, but may be any suitable function of one or more slew reach lengths, one or more timing reach lengths, constants, or other variables within the scope of the invention. For example, buffer slew/timing reach length constraints may also depend on the timing criticality of the net. For example, if a net has much shorter delay than required to meet the chip timing, then only buffer slew reach length needs to be considered for this net.

As another example, in a multi-pin routing, length between a first pair of pins may be L1, length between another pair of pins may be L2, and length between a third pair of pins may be L3. A buffer slew/timing reach length constraint may be a specific slew reach length. A length (L) satisfying the buffer slew/timing reach length constraint may be computed using any of the following example functions—

$$Max(L2,L1)+L3=L; L<\text{buffer slew/timing reach length constraint}$$

$$SquareRoot(\text{square of }L2+\text{square of }L1)+L3=L; L<\text{buffer slew/timing reach length constraint}$$

$$(A*L3)*(L1+L2)+(B*\text{square of }L3)+C*\max(\text{square of }L1, \text{square of }L2)=L; L<\text{buffer slew/timing reach length constraint}$$

As an alternative to route 316-324-330, another route may be formed using buffers 316, 318, 332, 334, and 336 (referred to as route 316-332-336). Route 316-332-336 may require wire length 338 between buffers 318 and 332. Route 316-332-336 may avoid congesting channel 314 but may violate the buffer slew/timing reach length constraint because the size of blockage 306 may cause wire length 338 to exceed the buffer slew reach length and/or buffer timing reach length.

Another alternative route may be formed using buffers 340, 342, 344, 346, 348, and 330 (referred to as route 340-346-330). Route 340-346-330 may also cause similar problems.

A route may violate a scenic ratio constraint. A scenic ratio is a permissible ratio of the length of a route between two points to a maximum desired wire length between the two points. A scenic ratio constraint according to the invention is the constraint that the scenic ratio should not be exceeded. For example, a scenic ratio of 1.3 may inform that the length of the route between pins 302 and 304 may not exceed 1.3 multiple of length K. The scenic ratio constraint is satisfied when $L<1.3*K$ Thus, each of the three alternative routes computed using the prior art methods encounter a congestion or buffer placement problem recognized by the invention.

The illustrative embodiments provide a category of constraints called the "hard constraints" that must be satisfied for a computed route to be buffer-aware according to the invention. A set of hard constraints is one or more hard constraints. A buffer-aware route is a route that reduces congestion of an area of the design and places the buffers such that no hard constraints are violated. Buffer slew/timing reach length constraint and scenic ratio constraint are two such hard constraints and have been described above.

Plane and wirecode constraint is a two-part hard constraint. Plane constraint is a restriction on a router to place wires and/or buffers only in certain layers of the design. Wirecode constraint is a restriction on the type of wire that can be used for a particular route or part thereof. A type of wire may be described using the wire width, capacitance, resistance, or any other characteristic suitable for a particular design. Plane constraint and wirecode constraint may be regarded as separate constraints under certain circumstances.

Blockage constraint is a restriction on placing logic components or buffers on top of an area occupied by a blockage. Blockage constraint also includes restriction on routing from a particular layer to a particular other layer.

Figure 4:
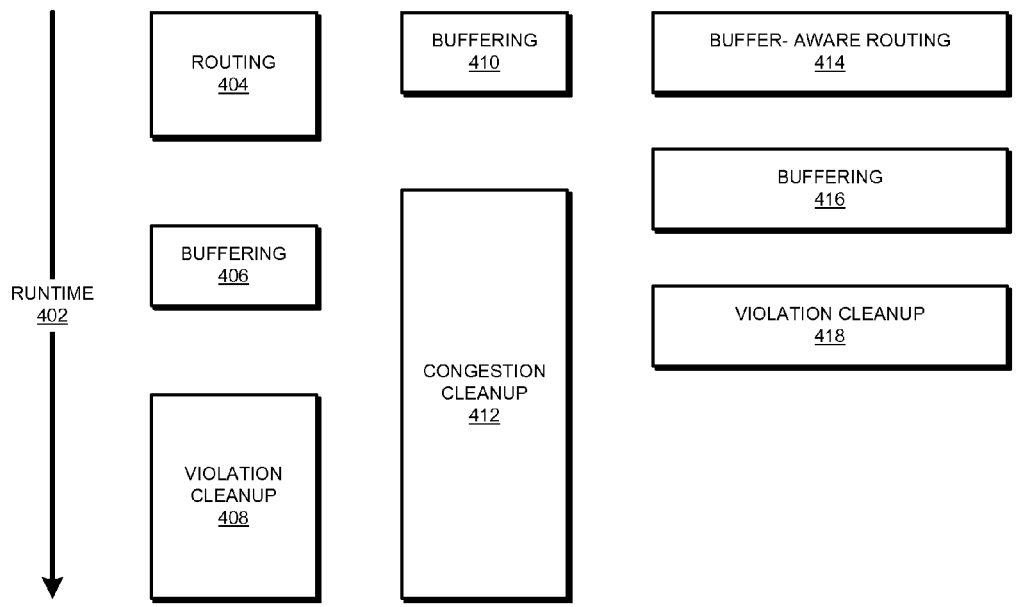
FIG. 4 depicts a block diagram for quantifying and comparing the runtime advantage of a router that has been improved in accordance with an illustrative embodiment.

With reference to FIG. 4, this figure depicts a block diagram for quantifying and comparing the runtime advantage of a router that has been improved in accordance with an illustrative embodiment. Runtime 402 is a scale to measure elapsed time.

In one prior art method, routing 404 is performed first to compute a set of viable routes between one or more pairs of pins in a design. A set of routes is one or more routes. Once the set of routes is computed, buffering 406 inserts buffers on the selected routes to adjust the slew and timing for those selected routes. Once the slew and timing characteristics of the buffered selected routes are within specified parameters, violation cleanup 408 attempts to remove as many design specification violations as possible. The sizes of blocks 404, 406, and 408 are approximate representation of the amount of time routing 404, buffering 406, and violation cleanup 408 takes according to this prior art method.

In another prior art method, such as the method employing Steiner algorithm, buffering 410 inserts the buffers in the design and optimum routes including those buffers are computed between pairs of pins. As described with respect to route 316-324-330 in FIG. 3, such a process creates congestion, such as in channel 314 in FIG. 3. Accordingly, congestion cleanup 412 is needed to attempt to remove as much congestion in the design as possible. The sizes of blocks 410 and 412 are approximate representation of the amount of time buffering 410 and congestion cleanup 412 takes according to this prior art method.

In accordance with an illustrative embodiment, buffer-aware routing 414 computes routes that can be buffered during buffering 416 without exceeding congestion specification or violating a hard constraint. Accordingly, violation cleanup 418 needs to cleanup only the violation of additional constraints, such as soft constraints or other design specification restrictions. An example of soft constraints may be the allowable wire length between pins.

The sizes of blocks 414, 416, and 418 are approximate representation of the amount of time buffer-aware routing 414, buffering 416, and violation cleanup 418 takes according to an embodiment of the invention. Total runtime consumed using either prior art method is significantly greater than the total runtime of an illustrative embodiment.

Figure 5:
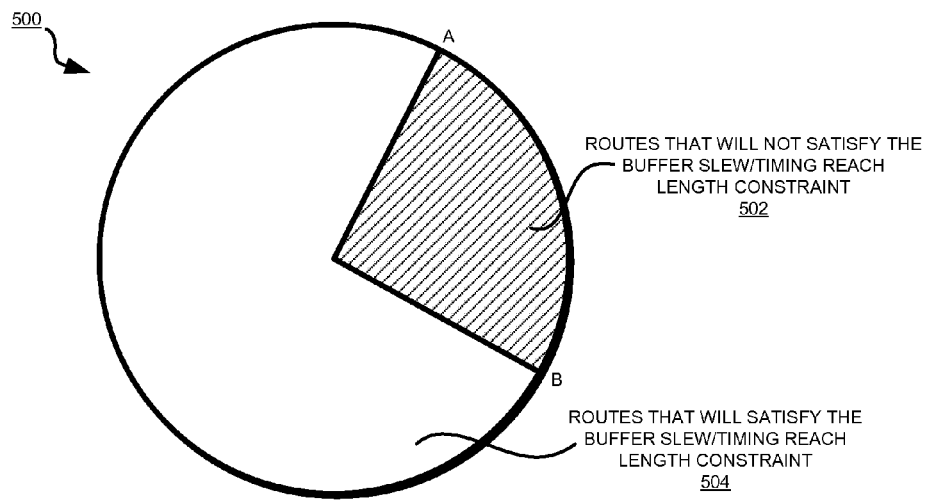
FIG. 5 depicts a pie chart representation of pruning a set of routes to comply with a hard constraint in accordance with an illustrative embodiment.

With reference to FIG. 5, this figure depicts a pie chart representation of pruning a set of routes to comply with a hard constraint in accordance with an illustrative embodiment. The pie chart in FIG. 5 represents set of routes 500 computed during routing 404 or buffering 410 in FIG. 4.

FIG. 5 depicts pruning the set of routes such that the routes in the remainder subset of routes are in compliance with one or more hard constraint according to an illustrative embodiment. As an example, an illustrative embodiment may determine that routes in subset 502 of set 500 will not satisfy the buffer slew/timing reach length constraint for the given design or part thereof. By implication, subset 504 includes routes that do satisfy the buffer slew/timing reach length constraint.

Figure 6:
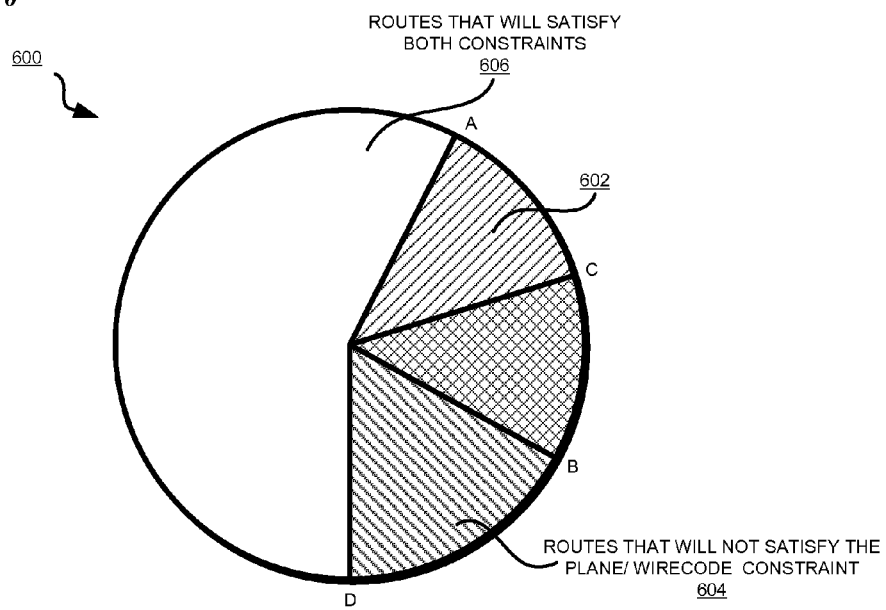
FIG. 6 depicts a pie chart representation of pruning a set of routes to comply with two hard constraints in accordance with an illustrative embodiment.

With reference to FIG. 6, this figure depicts a pie chart representation of pruning a set of routes to comply with two hard constraints in accordance with an illustrative embodiment. The pie chart in FIG. 6 represents set of routes 600 computed during routing 404 or buffering 410 in FIG. 4.

Given two hard constraints, FIG. 6 depicts pruning the set of routes such that the routes in the remainder subset of routes are in compliance with both hard constraints according to an illustrative embodiment. As an example, an illustrative embodiment may determine that routes in subset 602 of set 600 (arc between points A and B on the pie chart) will not satisfy the buffer slew/timing reach length constraint for the given design or part thereof.

The illustrative embodiment may also determine that routes in subset 604 of set 600 (arc between points C and D on the pie chart) will not satisfy the plane and wirecode constraint for the given design or part thereof. By implication, subset 606 includes routes that satisfy the two hard constraints.

The illustrative embodiment may identify subsets of violating routes, such as subsets 602 and 604, sequentially or in parallel. Furthermore, subsets of violating routes, such as subsets 602 and 604, may intersect with one another such that some routes in set 600 may violate both the specified hard constraints.

Figure 7:
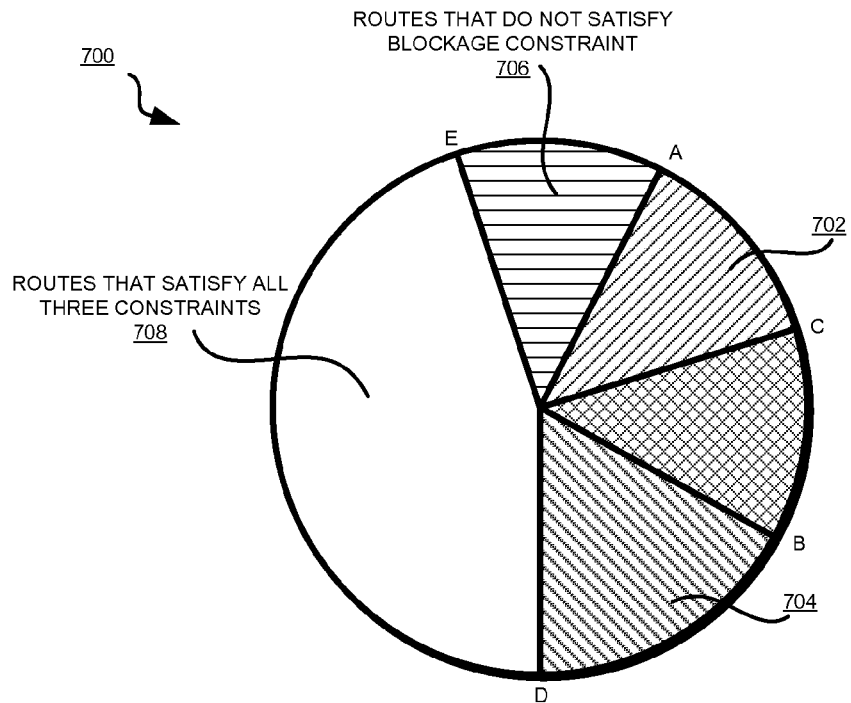
FIG. 7 depicts a pie chart representation of pruning a set of routes to comply with three hard constraints in accordance with an illustrative embodiment.

With reference to FIG. 7, this figure depicts a pie chart representation of pruning a set of routes to comply with three hard constraints in accordance with an illustrative embodiment. The pie chart in FIG. 7 represents set of routes 700 computed during routing 404 or buffering 410 in FIG. 4.

Given three hard constraints, FIG. 7 depicts pruning the set of routes such that the routes in the remainder subset of routes are in compliance with all three hard constraints according to an illustrative embodiment. Subset 702 (arc between points A and B on the pie chart) and subset 704 (arc between points C and D on the pie chart) are similar to subsets 602 and 604 respectively in FIG. 6, and are pruned from set 700 for similar reasons. As an example, an illustrative embodiment may also determine that routes in subset 706 of set 700 (arc between points A and E on the pie chart) will not satisfy the blockage constraint for the given design or part thereof.

Thus, subsets 702, 704, and 706 are pruned from set 700 of routes. By implication, subset 708 includes routes that satisfy the three hard constraints.

Figure 8:
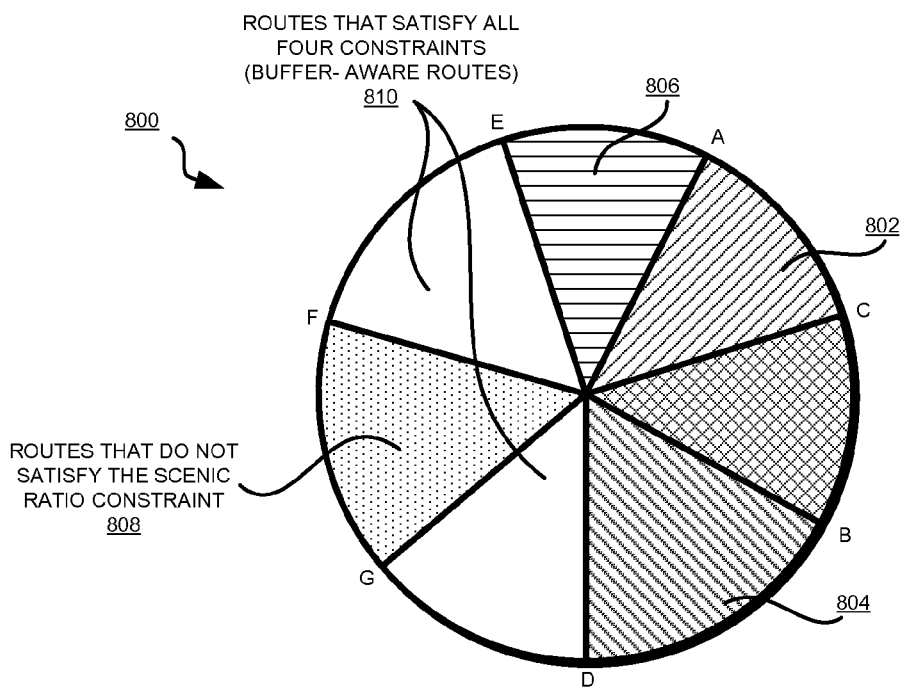
FIG. 8 depicts a pie chart representation of pruning a set of routes to comply with four hard constraints in accordance with an illustrative embodiment.

With reference to FIG. 8, this figure depicts a pie chart representation of pruning a set of routes to comply with four hard constraints in accordance with an illustrative embodiment. The pie chart in FIG. 8 represents set of routes 800 computed during routing 404 or buffering 410 in FIG. 4.

Given four hard constraints, FIG. 8 depicts pruning the set of routes such that the routes in the remainder subset of routes are in compliance with all four hard constraints according to an illustrative embodiment. Subset 802 (arc between points A and B on the pie chart), subset 804 (arc between points C and D on the pie chart), and subset 806 (arc between points A and E on the pie chart) are similar to subsets 702, 704, and 706 respectively in FIG. 7, and are pruned from set 800 for similar reasons. As an example, an illustrative embodiment may also determine that routes in subset 808 of set 800 (arc between points F and G on the pie chart) will not satisfy the scenic ratio constraint for the given design or part thereof.

Thus, subsets 802, 804, 806, and 808 are pruned from set 800 of routes. By implication, subset 810 includes routes that satisfy the four hard constraints. Thus, subset 810 includes buffer-aware routes according to an embodiment.

Figure 9:
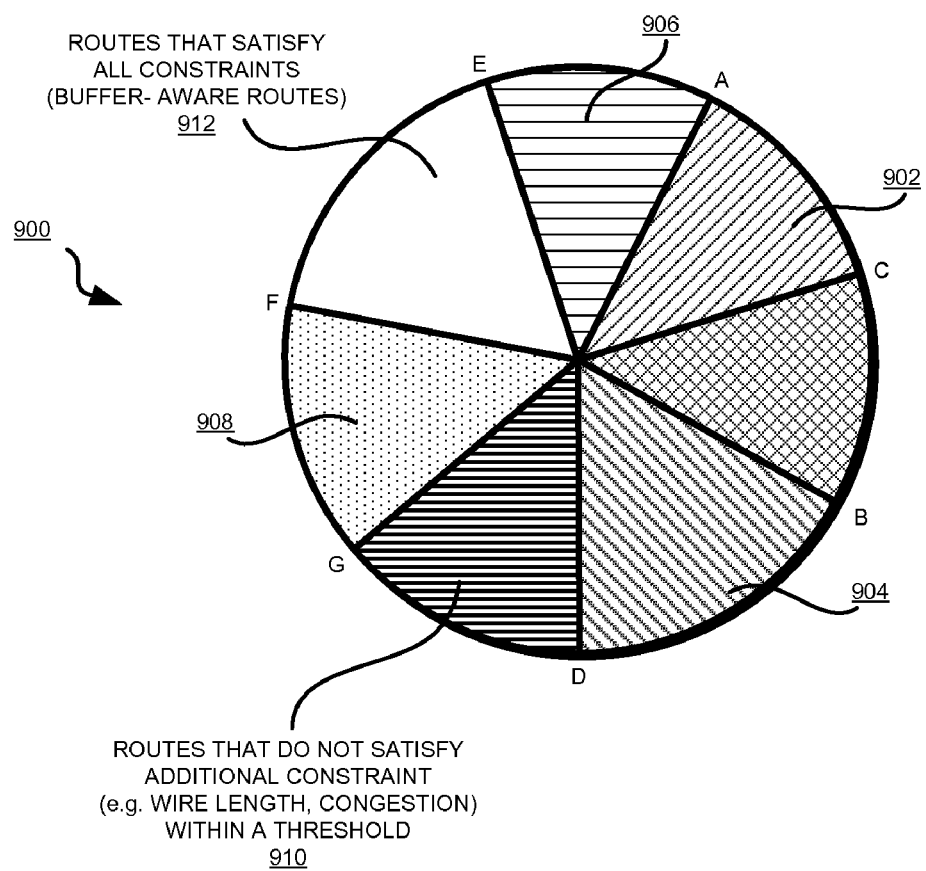
FIG. 9 depicts a pie chart representation of pruning a set of routes to comply with four hard constraints and an additional constraint in accordance with an illustrative embodiment.

With reference to FIG. 9, this figure depicts a pie chart representation of pruning a set of routes to comply with four hard constraints and an additional constraint in accordance with an illustrative embodiment. The pie chart in FIG. 9 represents set of routes 900 computed during routing 404 or buffering 410 in FIG. 4.

The additional constraint may be a soft constraint or a design restriction and may have an associated threshold. The threshold may specify an extent to which the additional constraint may be violated if necessary, but not beyond. For example, a maximum wire length of 1.5 mm may be an additional constraint. A threshold may be 0.15 mm, informing that if necessary, a wire length may exceed 1.5 mm by up to 0.15 mm, but not more.

Thresholds may be specified in any manner suitable for the given additional constraint. For example, the threshold for the maximum wire length additional constraint may be specified as 10%. A threshold of 10% may inform that if necessary, a wire length may exceed 1.5 mm by up to 10%, but not more. As another example, the same threshold may be specified as 1.65 mm, informing that if necessary, a wire length may be up to 1.65 mm, but not more.

Given four hard constraints and an additional constraint with a threshold, FIG. 9 depicts pruning the set of routes such that the routes in the remainder subset of routes are in compliance with all four hard constraints and with the additional constraint within the threshold. Subset 902 (arc between points A and B on the pie chart), subset 904 (arc between points C and D on the pie chart), subset 906 (arc between points A and E on the pie chart), and subset 908 (arc between points F and G on the pie chart) are similar to subsets 802, 804, 806, and 808 respectively in FIG. 8, and are pruned from set 900 for similar reasons. As an example, an illustrative embodiment may also determine that routes in subset 910 of set 900 (arc between points G and D on the pie chart) will not satisfy the additional constraint within the specified threshold for the given design or part thereof.

Thus, subsets 902, 904, 906, 908, and 910 are pruned from set 900 of routes. By implication, subset 912 includes routes that satisfy the four hard constraints and the additional constraint within the specified threshold. Thus, subset 912 includes buffer-aware routes according to an embodiment.

Pruning described in FIGS. 5, 6, 7, 8, and 9 is not intended to imply any limitation on the order of pruning and enforcing hard constraints. Pruning described in FIGS. 5, 6, 7, 8, and 9 is also not intended to imply any limitation on the number of hard constraints. In addition to the hard constraints described in FIGS. 3-9, an implementation may designate any additional constraint and any number thereof as additional hard constraints that should not be violated.

Pruning the set of routes for compliance with hard constraints can be performed in any order of the hard constraints, or in parallel for more than one hard constraint, within the scope of the invention.

Furthermore, pruning of the set of routes can be accomplished in at least two different ways. In a first manner of pruning, a set of routes may be generated first, such as by using a prior art router. A component implementing an illustrative embodiment may then prune the set in the manner described with respect to FIGS. 5-9.

Alternatively, a router, such as router 107 in FIG. 1, may be modified to include logic for terminating a route computation if the route being computed will violate one or more hard constraints or will violate any additional constraints beyond a threshold. Pruning occurs by avoiding the computation of violating routes. Thus, the modified (improved) router will produce a set of routes such that the routes in the set satisfy all the hard constraints and any additional constraint within the additional constraint's threshold.

Other ways of integrating an illustrative embodiment with an IC design tool will become apparent from this disclosure to those of ordinary skill in the art. Such other ways are contemplated within the scope of the invention. For example, within the scope of the invention, an implementation may use a combination the above-described two ways—pruning a set after generation for one part of the design, and preventing a route that will violate a constraint from being generated for another part of the design.

Additionally, an illustrative embodiment may be used in conjunction with a design that may specify different hard and soft constraints for different parts of the design. For example, an illustrative embodiment may perform buffer-aware routing for that part of the design first that has the tightest layer range in the plane constraint.

As another example, an illustrative embodiment may perform buffer-aware routing earlier for that part of the design that has a higher layer range as compared the another part that has a lower layer range. Generally, a higher layer range indicates a part of the design that is more timing critical than the part with the lower layer range, such as when layers are assigned based on timing.

As another example, within each plane group, an illustrative embodiment may perform buffer-aware routing of that subgroup first which has non-single wirecodes associated therewith. For example, B-2W2S may be routed before B-single.

As another example, nets may be grouped based on plane/wirecode constraints of the respective nets. The groups may be ordered in some logical manner. For each group according to the ordering, an illustrative embodiment may regenerate routing grid with blockage or capacity updated for specific layer range. The illustrative embodiment may then perform buffer-aware routing for nets with higher scenic ratio before routing nets with lower scenic ratios. The illustrative embodiment may determine the reach buffer slew/timing reach length constraint (reach length constraint) to use when routing over blockages. For example, the illustrative embodiment may use one or more values for the reach length constraint if routing nets with flexible plane ranges but may route at least above the ceiling layer of the blockage.

The illustrative embodiment may then assign the layers and perform buffer-aware routing iteratively until a satisfactory buffer-aware routing solution is reached. Upon reaching the buffer-aware routing solution, the illustrative embodiment may consider soft constraints and further narrow the solution.

The operation of an illustrative embodiment described above is only an example and is not intended to be limiting on the invention. Many other design considerations may be similarly incorporated in performing buffer-aware routing using an illustrative embodiment without departing from the scope of the invention.

Figure 10:
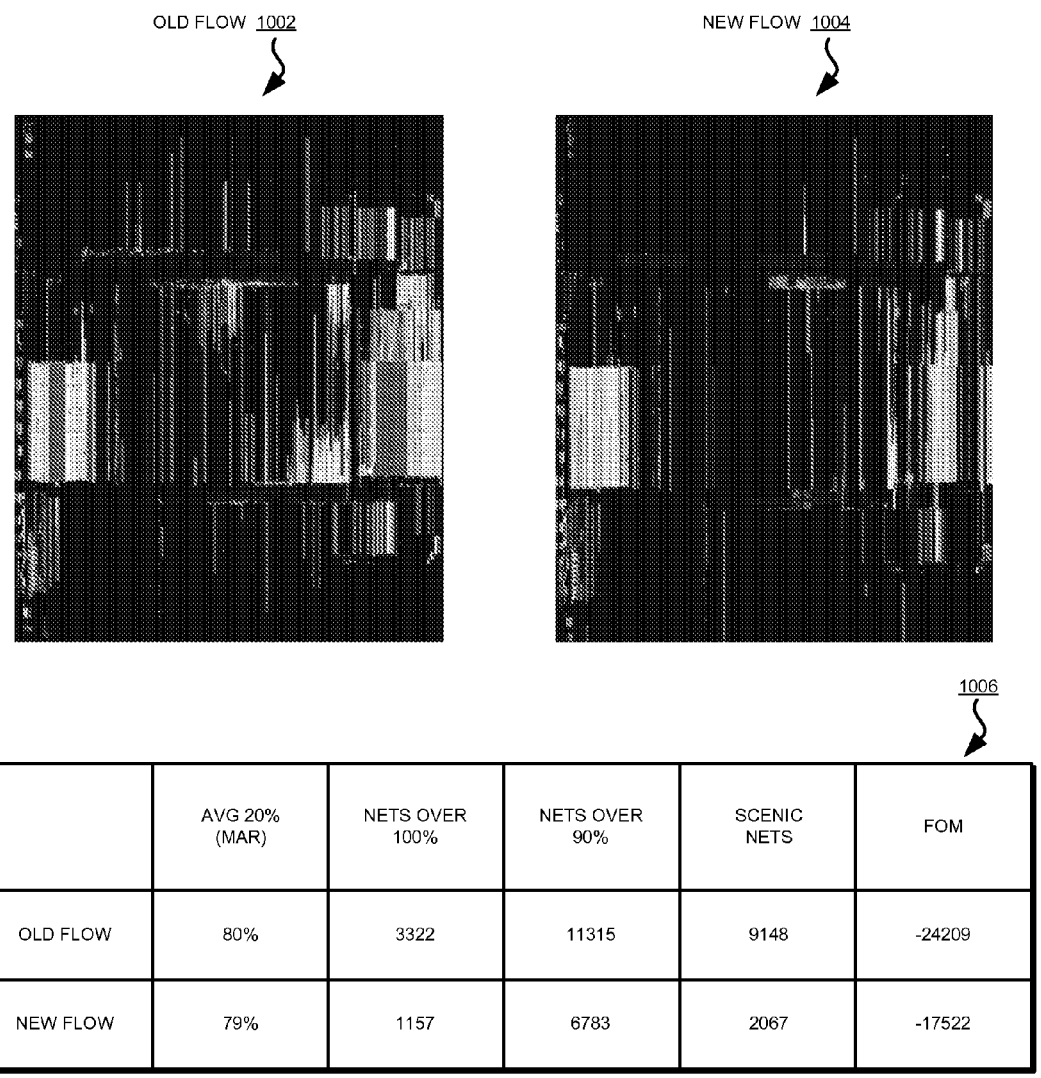
FIG. 10 depicts a comparative rendering of an example routed design to illustrate certain advantages of buffer-aware routing according to an illustrative embodiment over the prior art routing methods.

With reference to FIG. 10, this figure depicts a comparative rendering of an example routed design to illustrate certain advantages of buffer-aware routing according to an illustrative embodiment over the prior art routing methods. Old flow 1002 depicts a rendering of a routed design created using an old flow, to wit, a prior art routing method. New flow 1004 depicts a rendering of a routed design created using buffer-aware routing according to an embodiment. The lighter shades on the right side of the renderings in 1002 and 1004 represent congestion in the right side of those designs.

Table 1006 provides numeric comparison of the results of old flow 1002 and new flow 1004, when performed on the same example design. The average congestion of nets with worst 20% congestion is reduced from 80% to 79% by the new flow. Nets over 100% congested have reduced in number from 3322 to 1157 due to the new flow. Nets over 90% congested have reduced in number from 11315 to 6783 due to the new flow. Scenic nets have reduced in number from 9148 to 2067 due to the new flow. The overall timing figure of merit (FOM) has improved from −24209 to −17522 due to the new flow.

Figure 11:
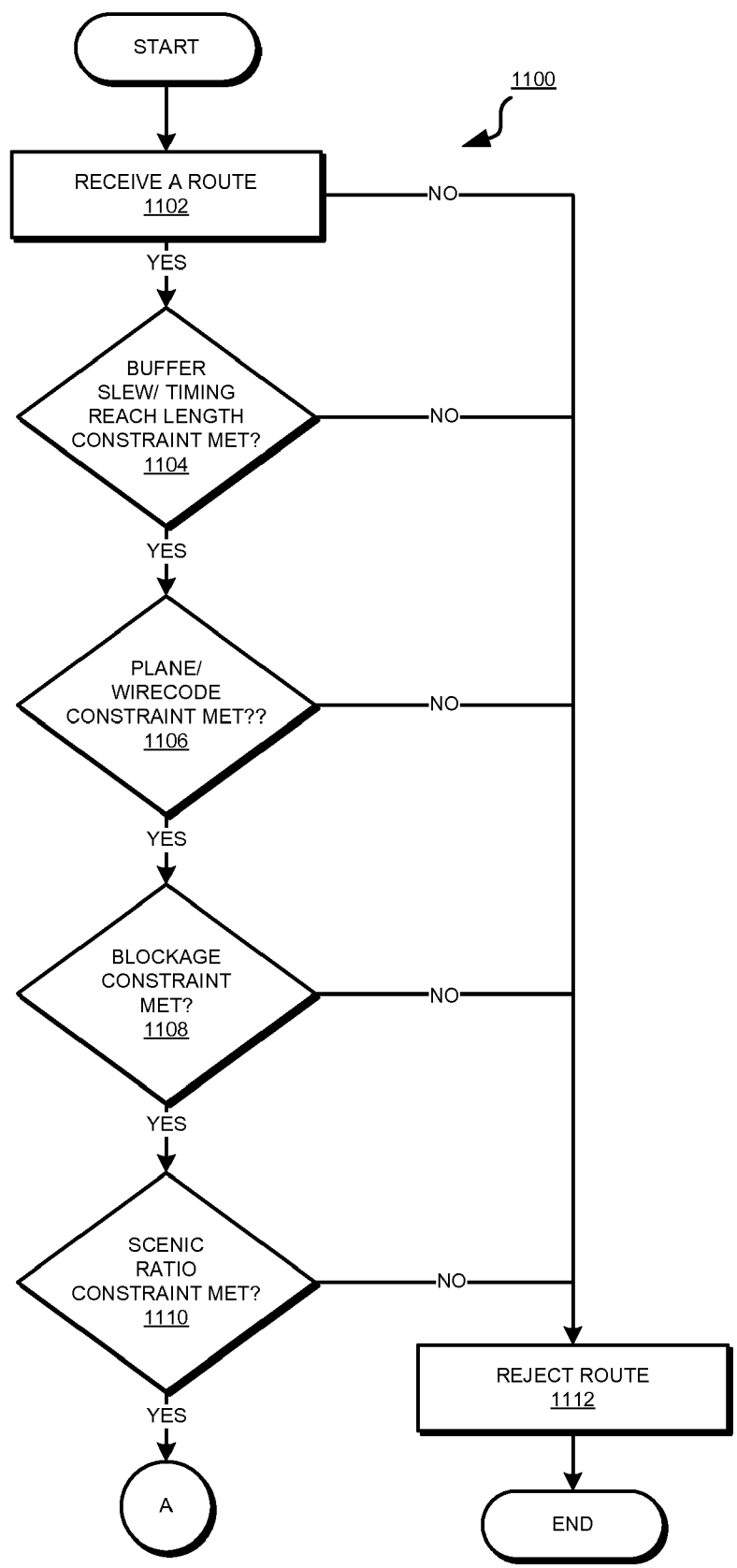
FIG. 11 depicts a flowchart of an example process of performing buffer-aware routing in accordance with an illustrative embodiment.

With reference to FIG. 11, this figure depicts a flowchart of an example process of performing buffer-aware routing in accordance with an illustrative embodiment. Process 1100 may be implemented in an IC design tool, such as IC design tool 105 in FIG. 1. For example, process 1100 may operate in conjunction with router 107 in FIG. 1.

Process 1100 begins by receiving a route from a set of routes (step 1102). Process 1100 determines whether a buffer slew/timing reach length constraint is met or satisfied by the route (step 1104).

If the route satisfies the reach length constraint ("Yes" path of step 1104), process 1100 determines whether a plane/wirecode constraint is met or satisfied by the route (step 1106). If the route satisfies the plane/wirecode constraint ("Yes" path of step 1106), process 1100 determines whether a blockage constraint is met or satisfied by the route (step 1108). If the route satisfies the blockage constraint ("Yes" path of step 1108), determines whether a scenic ratio constraint is met or satisfied by the route (step 1110). IF the route satisfies the scenic ratio constraint ("Yes" path of step 1110), process 1100 may exit at exit point marked "A" to enter another process that has a corresponding entry point marked "A".

If the route does not satisfy the reach length constraint ("No" path of step 1104), or if the route does not satisfy the plane/wirecode constraint ("No" path of step 1106), or if the route does not satisfy the blockage constraint ("No" path of step 1108), or if the route does not satisfy the scenic ratio constraint ("No" path of step 1110), process 1100 rejects the route (step 1112). Process 1100 may end thereafter or return to step 1102 to evaluate another route from the set of routes.

Process 1100 is described using the four hard constraints only as an example. Additional hard constraints may be similarly integrated into process 1100 within the scope of the invention.

Process 1100 is described using the four hard constraints sequentially and in the depicted order only as an example. These and other hard constraints may be evaluated in other sequences or in parallel in process 1100 within the scope of the invention.

Figure 12:
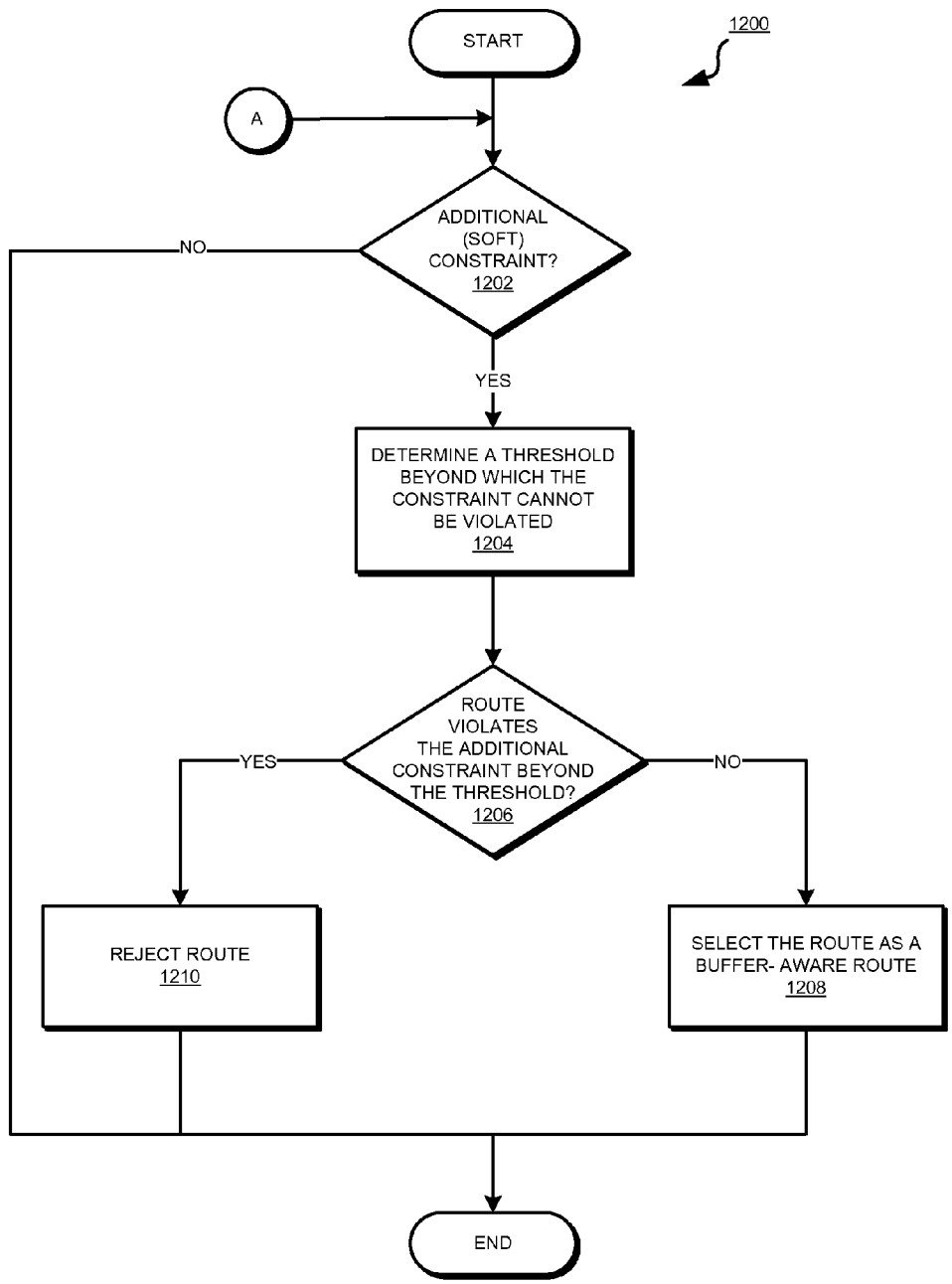
FIG. 12 depicts a flowchart of an example process of buffer-aware routing in accordance with an illustrative embodiment.

With reference to FIG. 12, this figure depicts a flowchart of an example process of buffer-aware routing in accordance with an illustrative embodiment. Process 1200 may be implemented in a manner similar to process 1100 in FIG. 11.

Process 1200 begins by determining whether an additional or soft constraint has been specified (step 1202). If no additional or soft constraints have been specified ("No" path of step 1202), process 1200 ends thereafter. Another process, such as process 1100 in FIG. 11 may also enter process 1200 at entry point marked "A" and proceed to step 1202.

If an additional or soft constraint has been specified ("Yes" path of step 1202), process 1200 determines a threshold value beyond which the constraint of step 1202 cannot be violated (step 1204). Process 1200 determines whether a given route, such as the route of step 1102 in FIG. 11, violates the constraint of step 1202 beyond the threshold of step 1204 (step 1206).

If the route does not violate the constraint beyond the threshold ("No" path of step 1206), process 1200 selects the route as a buffer-aware route (step 1208). Process 1200 ends thereafter. If the route violates the constraint beyond the threshold ("Yes" path of step 1206), process 1200 rejects the route (step 1210). Process 1200 ends thereafter.

Figure 13:
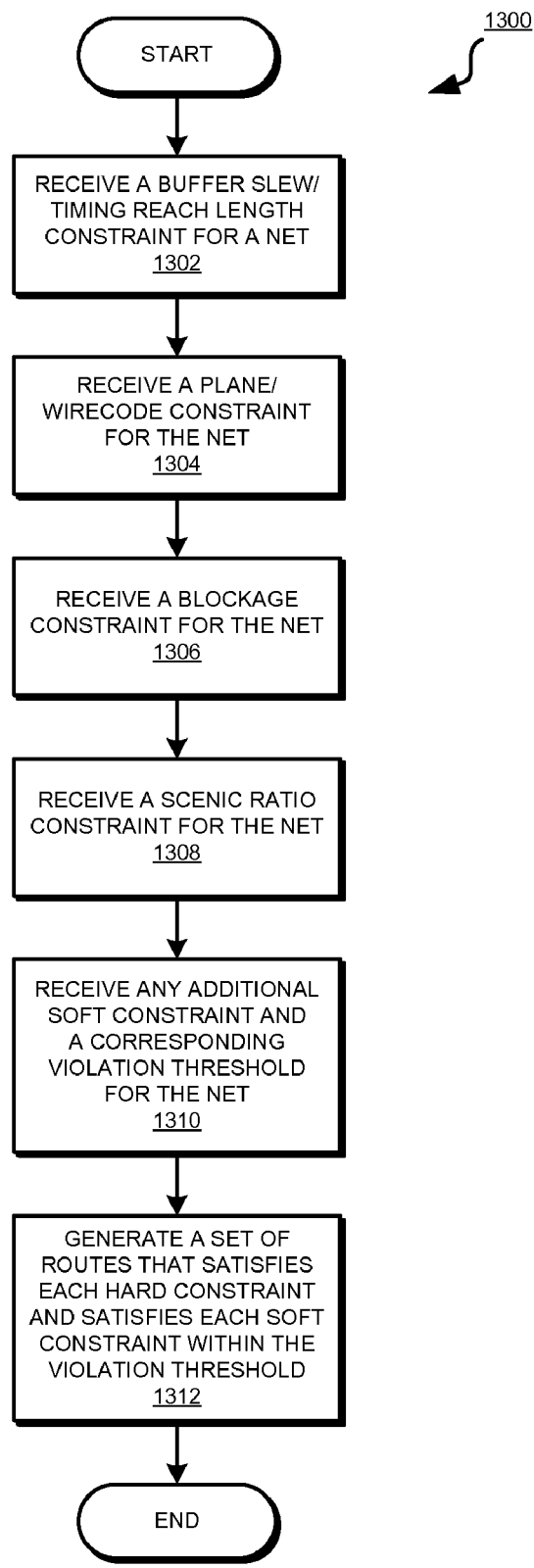
FIG. 13 depicts a flowchart of another example process of performing buffer-aware routing in accordance with an illustrative embodiment.

With reference to FIG. 13, this figure depicts a flowchart of another example process of performing buffer-aware routing in accordance with an illustrative embodiment. Process 1300 may be implemented in router 107 in FIG. 1 form an improved router (buffer-aware router) according to an illustrative embodiment.

Process 1300 begins by receiving a buffer slew/timing reach length constraint, to wit, the reach length constraint, as a hard constraint for a net (step 1302). Process 1300 receives a plane/wirecode constraint as another hard constraint for the net (step 1304). Process 1300 receives a blockage constraint as another hard constraint for the net (step 1306). Process 1300 receives a scenic ratio constraint as another hard constraint for the net (step 1308). Process 1300 receives any additional (soft) constraint and a corresponding threshold (violation threshold) for the net (step 1310).

Process 1300 generates a set of routes that satisfies each hard constraint and satisfies each soft constraint within the violation threshold (step 1312). Process 1300 ends thereafter.

The components in the block diagrams and the steps in the flowcharts described above are described only as examples. The components and the steps have been selected for the clarity of the description and are not limiting on the illustrative embodiments. For example, a particular implementation may combine, omit, further subdivide, modify, augment, reduce, or implement alternatively, any of the components or steps without departing from the scope of the illustrative embodiments. Furthermore, the steps of the processes described above may be performed in a different order within the scope of the illustrative embodiments.

Thus, a computer implemented method, apparatus, and computer program product are provided in the illustrative embodiments for buffer-aware routing in integrated circuit design. Using the illustrative embodiments, an area of a chip may be decomposed into g-cells. Routing within the g-cell is deferred to a detailed router. 2D buffer-aware routing according to an illustrative embodiment is performed followed by layer assignment, or 3D buffer-aware routing is performed according to an illustrative embodiment. Buffer-aware routes generated according to an illustrative embodiment do not violate any hard constraints, and violate soft constraints only within their respective thresholds.

The illustrative embodiments provide several ways of modifying, transforming, altering, improving, changing, reconfiguring, re-placing, re-positioning, or otherwise manipulating objects including buffers and wires for routing of an IC design. The several ways of manipulating objects in a given placement can be combined, repeated, or used in isolation as may be suitable for a particular implementation.

The illustrative embodiments may be implemented by modifying an existing router or IC design tool. The illustrative embodiments may be implemented by having new applications, tools, or components thereof, operate in coordination with existing router or IC design tool.

The invention can take the form of an entirely software embodiment, or an embodiment containing both hardware and software elements. In a preferred embodiment, the invention is implemented in software or program code, which includes but is not limited to firmware, resident software, and microcode.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code. A client data processing system may download that computer usable code, such as for storing on a data storage medium associated with the client data processing system, or for using in the client data processing system. The server data processing system may similarly upload computer usable code from the client data processing system. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

What is claimed is:

1. A computer implemented method for buffer-aware routing in a design of an integrated circuit having cells, the circuit including buffers and wires, the computer implemented method comprising:
    receiving a route from a set of routes, the route coupling a first point in the circuit to a second point in the circuit and including at least one buffer between the first point and the second point;
    determining, using a processor and a memory, whether the route violates a set of hard constraints for a part of the circuit, wherein the set of hard constraints includes a reach length constraint, wherein the reach length constraint is a constraint on a length of routes between any two points in the circuit such that the slew and timing characteristics of a signal over a given route meets a design specification for slew and delay for the signal in the design; and
    selecting, responsive to the route not violating any hard constraint in the set of hard constraints, the route as a buffer-aware routing solution between the first and the second points in the circuit.

2. The computer implemented method of claim 1, wherein the set of hard constraints further includes a plane constraint, wherein the plane constraint restricts the route to a specific plane in the design.

3. The computer implemented method of claim 1, wherein the set of hard constraints further includes a wirecode constraint, wherein the wirecode constraint restricts the route to use at least one specific type of wire.

4. The computer implemented method of claim 1, wherein the set of hard constraints further includes a blockage constraint, wherein the blockage constraint prohibits placement of a buffer over a blockage at a specified layer of the design.

5. The computer implemented method of claim 1, wherein the set of hard constraints further includes a scenic ratio constraint, wherein the scenic ratio constraint restricts a length of the route to a specific proportion of a desired length for the route in the design.

6. The computer implemented method of claim 1, further comprising:
    determining whether the route violates a soft constraint for the part of the circuit, wherein a violation threshold is associated with the soft constraint, and wherein the selecting is further responsive to the route not violating the soft constraint beyond the threshold.

7. A computer implemented method for buffer-aware routing in a design of an integrated circuit having cells, the circuit including buffers and wires, the computer implemented method comprising:
    beginning, using a processor and a memory, a route computation, the route being computed to couple a first point in the circuit to a second point in the circuit by including at least one buffer between the first point and the second point;
    determining whether the route being computed violates a set of hard constraints for a part of the circuit, wherein the set of hard constraints includes a reach length constraint, wherein the reach length constraint is a constraint on a length of routes between any two points in the circuit such that the slew and timing characteristics of a signal over a given route meets a design specification for slew and delay for the signal in the design; and
    terminating the route computation, responsive to the route violating any hard constraint in the set of hard constraints.

8. The computer implemented method of claim 7, wherein the set of hard constraints further includes a plane constraint, wherein the plane constraint restricts the route to a specific plane in the design.

9. The computer implemented method of claim 7, wherein the set of hard constraints further includes a wirecode constraint, wherein the wirecode constraint restricts the route to use at least one specific type of wire.

10. The computer implemented method of claim 7, wherein the set of hard constraints further includes a blockage constraint, wherein the blockage constraint prohibits placement of a buffer over a blockage at a specified layer of the design.

11. The computer implemented method of claim 7, wherein the set of hard constraints further includes a scenic ratio constraint, wherein the scenic ratio constraint restricts a length of the route to a specific proportion of a desired length for the route in the design.

12. The computer implemented method of claim 7, further comprising:
    determining whether the route violates a soft constraint for the part of the circuit, wherein a violation threshold is associated with the soft constraint, and wherein the terminating is responsive to the route violating the soft constraint beyond the threshold.

13. A computer usable program product comprising a computer usable storage device including computer usable code for buffer-aware routing in a design of an integrated circuit having cells, the circuit including buffers and wires, the computer usable code comprising:
    computer usable code for receiving a route from a set of routes, the route coupling a first point in the circuit to a second point in the circuit and including at least one buffer between the first point and the second point;
    computer usable code for determining whether the route violates a set of hard constraints for a part of the circuit, wherein the set of hard constraints includes a reach length constraint, wherein the reach length constraint is a constraint on a length of routes between any two points in the circuit such that the slew and timing characteristics of a signal over a given route meets a design specification for slew and delay for the signal in the design; and
    computer usable code for selecting, responsive to the route not violating any hard constraint in the set of hard constraints, the route as a buffer-aware routing solution between the first and the second points in the circuit.

14. The computer usable program product of claim 13, wherein the set of hard constraints further includes a plane constraint, wherein the plane constraint restricts the route to a specific plane in the design.

15. The computer usable program product of claim 13, wherein the set of hard constraints further includes a wirecode constraint, wherein the wirecode constraint restricts the route to use at least one specific type of wire.

16. The computer usable program product of claim 13, wherein the set of hard constraints further includes a blockage constraint, wherein the blockage constraint prohibits placement of a buffer over a blockage at a specified layer of the design.

17. The computer usable program product of claim 13, wherein the set of hard constraints further includes a scenic ratio constraint, wherein the scenic ratio constraint restricts a length of the route to a specific proportion of a desired length for the route in the design.

18. The computer usable program product of claim 13, further comprising:
   computer usable code for determining whether the route violates a soft constraint for the part of the circuit, wherein a violation threshold is associated with the soft constraint, and wherein the selecting is further responsive to the route not violating the soft constraint beyond the threshold.

19. A computer usable program product comprising a computer usable storage device including computer usable code for buffer-aware routing in a design of an integrated circuit having cells, the circuit including buffers and wires, the computer usable code comprising:
   computer usable code for beginning a route computation, the route being computed to couple a first point in the circuit to a second point in the circuit by including at least one buffer between the first point and the second point;
   computer usable code for determining whether the route being computed violates a set of hard constraints for a part of the circuit, wherein the set of hard constraints includes a reach length constraint, wherein the reach length constraint is a constraint on a length of routes between any two points in the circuit such that the slew and timing characteristics of a signal over a given route meets a design specification for slew and delay for the signal in the design; and
   computer usable code for terminating the route computation, responsive to the route violating any hard constraint in the set of hard constraints.

20. The computer usable program product of claim 19, wherein the set of hard constraints further includes a plane constraint, wherein the plane constraint restricts the route to a specific plane in the design.

21. The computer usable program product of claim 19, wherein the set of hard constraints further includes a wirecode constraint, wherein the wirecode constraint restricts the route to use at least one specific type of wire.

22. The computer usable program product of claim 19, wherein the set of hard constraints further includes a blockage constraint, wherein the blockage constraint prohibits placement of a buffer over a blockage at a specified layer of the design.

23. The computer usable program product of claim 19, wherein the set of hard constraints further includes a scenic ratio constraint, wherein the scenic ratio constraint restricts a length of the route to a specific proportion of a desired length for the route in the design.

24. The computer usable program product of claim 19, further comprising:
   computer usable code for determining whether the route violates a soft constraint for the part of the circuit, wherein a violation threshold is associated with the soft constraint, and wherein the terminating is responsive to the route violating the soft constraint beyond the threshold.

25. The computer usable program product of claim 19, wherein the computer usable code is stored in a computer readable storage medium in a data processing system, and wherein the computer usable code is transferred over a network from a remote data processing system.

26. The computer usable program product of claim 19, wherein the computer usable code is stored in a computer readable storage medium in a server data processing system, and wherein the computer usable code is downloaded over a network to a remote data processing system for use in a computer readable storage medium associated with the remote data processing system.

27. A data processing system for buffer-aware routing in a design of an integrated circuit having cells, the circuit including buffers and wires, the data processing system comprising:
   a storage device including a storage medium, wherein the storage device stores computer usable program code; and
   a processor, wherein the processor executes the computer usable program code, and wherein the computer usable program code comprises:
   computer usable code for receiving a route from a set of routes, the route coupling a first point in the circuit to a second point in the circuit and including at least one buffer between the first point and the second point;
   computer usable code for determining whether the route violates a set of hard constraints for a part of the circuit, wherein the set of hard constraints includes a reach length constraint,
   wherein the reach length constraint is a constraint on a length of routes between any two points in the circuit such that the slew and timing characteristics of a signal over a given route meets a design specification for slew and delay for the signal in the design; and
   computer usable code for selecting, responsive to the route not violating any hard constraint in the set of hard constraints, the route as a buffer-aware routing solution between the first and the second points in the circuit.

28. The data processing system of claim 27, wherein the set of hard constraints further includes a plane constraint, wherein the plane constraint restricts the route to a specific plane in the design.

29. The data processing system of claim 27, wherein the set of hard constraints further includes a wirecode constraint, wherein the wirecode constraint restricts the route to use at least one specific type of wire.

30. The data processing system of claim 27, wherein the set of hard constraints further includes a blockage constraint, wherein the blockage constraint prohibits placement of a buffer over a blockage at a specified layer of the design.

* * * * *